(12) United States Patent
Prushinskiy et al.

(10) Patent No.: US 8,927,180 B2
(45) Date of Patent: Jan. 6, 2015

(54) METHOD OF MANUFACTURING A MASK

(75) Inventors: Valeriy Prushinskiy, Yongin-si (KR);
Wonsik Hyun, Yongin-si (KR);
HeungYeol Na, Yongin-si (KR); Minsoo Kim, Yongin-si (KR); YoungShin Pyo, Yongin-si (KR); JaeMin Hong, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 156 days.

(21) Appl. No.: 13/463,179

(22) Filed: May 3, 2012

(65) Prior Publication Data

US 2013/0071775 A1   Mar. 21, 2013

(30) Foreign Application Priority Data

Sep. 15, 2011   (KR) ........................ 10-2011-0093072

(51) Int. Cl.
| | |
|---|---|
| *G03F 1/76* | (2012.01) |
| *G03F 1/80* | (2012.01) |
| *C23F 1/02* | (2006.01) |
| *G03F 1/20* | (2012.01) |

(52) U.S. Cl.
CPC ... *G03F 1/20* (2013.01); *G03F 1/80* (2013.01); *C23F 1/02* (2013.01); *G03F 1/76* (2013.01)

USPC ................................................. 430/5; 216/12

(58) Field of Classification Search
CPC ................ G03F 1/76; G03F 1/80; C23F 1/02
USPC ................................................. 430/5; 216/12
See application file for complete search history.

(56) References Cited

U.S. PATENT DOCUMENTS

| 5,348,825 | A | * | 9/1994 | Nakamura et al. ................. 430/5 |
| 5,756,237 | A | * | 5/1998 | Amemiya ......................... 430/5 |
| 6,492,070 | B1 | * | 12/2002 | Kobinata .......................... 430/5 |
| 2004/0104197 | A1 | * | 6/2004 | Shigemura et al. ............. 216/20 |
| 2010/0192856 | A1 | | 8/2010 | Sung et al. |

FOREIGN PATENT DOCUMENTS

| JP | 8-106152 A | 4/1996 |
| JP | 2004-232026 A | 8/2004 |
| JP | 2005-183153 A | 7/2005 |
| JP | 2009-74160 A | 4/2009 |
| KR | 10-2000-0006852 | 2/2000 |
| KR | 10-2010-0090070 | 8/2010 |
| KR | 10-2011-0013244 | 2/2011 |

\* cited by examiner

*Primary Examiner* — Stephen Rosasco
*Assistant Examiner* — John S Ruggles
(74) *Attorney, Agent, or Firm* — Robert E. Bushnell, Esq.

(57) ABSTRACT

A method of manufacturing a mask may include forming initial ribs and removing edge portions of the initial ribs to form final ribs, each of which has a top width smaller than that of the initial rib. A space between the initial ribs may be smaller than a width of a slit limited by the final ribs.

17 Claims, 10 Drawing Sheets

METHOD OF MANUFACTURING A MASK

CLAIM OF PRIORITY

This application makes reference to, incorporates the same herein, and claims all benefits accruing under 35 U.S.C. §119 from an application earlier filed in the Korean Intellectual Property Office on the 15 Sep. 2011 and there duly assigned Ser. No. 10-2011-0093072.

BACKGROUND OF THE INVENTION

Field of the Invention

The present invention relates generally to a method of manufacturing a mask. More particularly, the invention relates to a method of manufacturing a deposition mask used for a deposition process or a photomask used for an exposure process.

The formation of a flat panel display or a semiconductor device may include steps of depositing thin patterns on a substrate. For example, the thin patterns may be directly formed on the substrate using a deposition mask. Alternatively, the thin patterns may be formed by transferring patterns, which are carved on a photomask, onto a layer deposited on the substrate. Recently, in order to meet the technical requirements for a high-density semiconductor device or a high-resolution flat panel display, a deposition mask or a photomask capable of depositing or transferring high-resolution patterns onto the substrate has been required.

SUMMARY OF THE INVENTION

Embodiments of the invention provide a method of manufacturing a mask with high-accuracy fine patterns.

According to embodiments of the invention, a method of manufacturing a mask may include patterning a mask substrate to form initial ribs, and removing upper edge portions of the initial ribs to form final ribs limiting slits and having top widths smaller than those of the initial ribs.

In some embodiments, the forming of the initial ribs and the forming of the final ribs may include at least one photolithography process.

In some embodiments, the forming of the initial ribs may include forming a first photoresist pattern on a top surface of the mask substrate, the first photoresist pattern having a top width greater than those of the final ribs, forming a second photoresist pattern on a bottom surface of the mask substrate to face the first photoresist pattern, the second photoresist pattern having a bottom width substantially equivalent to those of the final ribs, etching the top and bottom surfaces of the mask substrate using the first and second photoresist patterns as etching masks to form first and second recesses, forming a third photoresist pattern to cover the first photoresist pattern and the first recess, and etching the mask substrate using the first, second and third photoresist patterns as etching masks to form a through hole limiting sidewalls of the initial ribs.

In some embodiments, a space between the first photoresist patterns may be less than widths of the slits.

In some embodiments, the forming of the final ribs may include forming a bottom photoresist pattern to cover the second photoresist pattern and portions of the sidewalls of the initial ribs, and etching the upper edge portions of the initial ribs using the first to third photoresist patterns and the bottom photoresist pattern as etching masks. In plan view, the bottom photoresist pattern may have a width substantially equivalent to top widths of the final ribs.

In some embodiments, the forming of the final ribs may include removing the first to third photoresist patterns, forming a bottom photoresist pattern to cover bottom surfaces and the sidewalls of the initial ribs, forming an upper photoresist pattern on top surfaces of the initial ribs, the upper photoresist pattern having a width substantially equivalent to the top widths of the final ribs and facing the bottom photoresist pattern, and etching the upper edge portions of the initial ribs using the upper and bottom photoresist patterns as etching masks.

In some embodiments, the forming of a through hole may be performed in an isotropic etching manner using a wet etching process.

In some embodiments, the mask may be a deposition mask used for a deposition process or a photo mask used for a photolithography process.

In some embodiments, each of the final ribs may have a mirror-symmetric trapezoidal section, the top width of which may be greater than a bottom width thereof, and the final rib may include a linear sidewall extending downward from an edge of the top surface thereof along a vertical direction and a curved sidewall extending from an edge of the linear sidewall to an edge of the bottom surface thereof in an upward concave manner.

According to embodiments of the invention, a method of manufacturing a mask may include forming an initial rib using a photolithography process, and removing upper edge portions of the initial rib using a photolithography process to form a final rib limiting a slit and having a top width smaller than that of the initial rib. The final rib may have a mirror-symmetric trapezoidal section, the top width of which may be greater than a bottom width thereof, and the final rib may include a linear sidewall extending downward from an edge of the top surface thereof along a vertical direction and a curved sidewall extending from an edge of the linear sidewall to an edge of the bottom surface thereof in an upward concave manner.

In some embodiments, the forming of the initial rib may include forming a first photoresist pattern on a top surface of a mask substrate, the first photoresist pattern including portions arranged with a space smaller than a width of the slit and each portion of the first photoresist pattern having a width greater than the top width of the final rib, forming a second photoresist pattern on a bottom surface of the mask substrate, the second photoresist pattern including portions, each of which may have a width substantially equivalent to a bottom width of the final rib and may be aligned with an axis passing through a center of the corresponding portion of the first photoresist pattern, etching the top surface of the mask substrate using the first photoresist pattern as an etching mask to form a first recess whose depth may be smaller than a vertical length of the linear sidewall of the final rib, and etching the bottom surface of the mask substrate using the second photoresist pattern as an etching mask to form a second recess whose depth may be smaller than a height of the curved sidewall of the final rib, forming a third photoresist pattern to cover the first photoresist pattern and the first recess, and etching the mask substrate using the first to third photoresist patterns as etching masks to form an extended curvilinear sidewall having a curvilinear length greater than that of the curved sidewall of the final rib.

In some embodiments, the forming of the final rib may include forming a bottom photoresist pattern to cover the second photoresist pattern and a portion of the extended curvilinear sidewall of the initial rib, and etching the extended curvilinear sidewall of the initial rib using the bottom photoresist pattern as an etching mask to form the final rib having the linear sidewall and the curved sidewall. In plan view, the bottom photoresist pattern may have a width substantially equivalent to the top width of the final rib.

In some embodiments, the forming of the final rib may include removing the first to third photoresist patterns, forming a bottom photoresist pattern to cover a bottom surface and the extended curvilinear sidewall of the initial rib, forming an upper photoresist pattern on the top surface of the initial rib, the upper photoresist pattern including portions, each of which may have a width substantially equivalent to the top width of the final rib and may be aligned with an axis passing through a center of the corresponding portion of the bottom photoresist pattern, and etching the upper edge portions of the initial rib using the upper and bottom photoresist patterns as etching masks to form the final rib having the linear sidewall and the curved sidewall.

In some embodiments, the mask may be a deposition mask used for a deposition process of a flat panel display and/or a semiconductor device, or a photo mask used for a photolithography process of a flat panel display and/or a semiconductor device.

In some embodiments, the forming of the extended curvilinear sidewall may be performed in an isotropic etching manner using a wet etching process.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

Figure 1A:
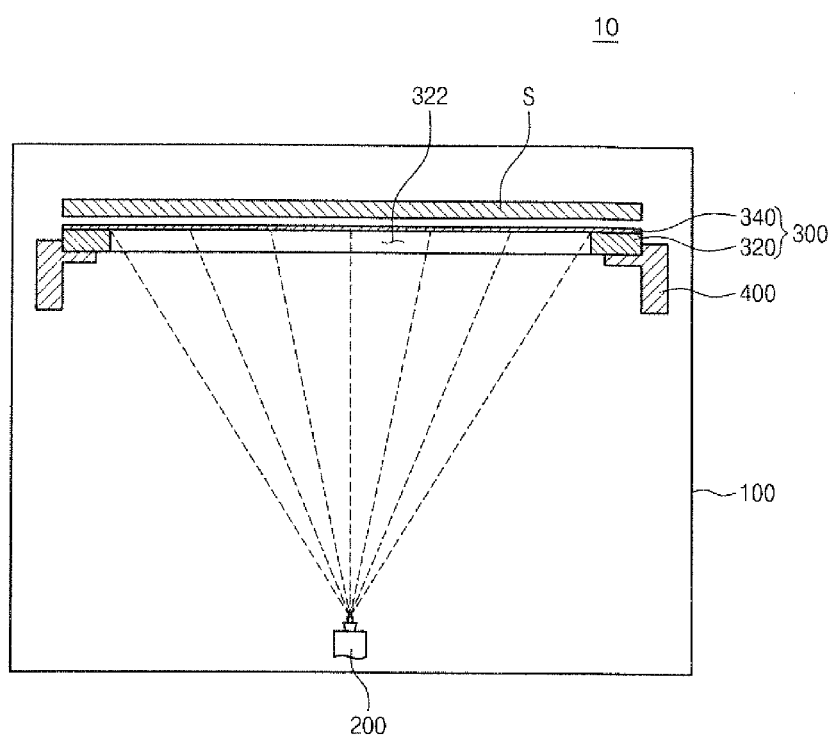
FIG. 1A is a sectional view of a deposition apparatus used for fabricating a flat panel display.

It should be noted that these figures are intended to illustrate the general characteristics of methods, structure and/or materials utilized in certain embodiments, and to supplement the written description provided below. However, these drawings are not to scale, and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE INVENTION

Exemplary embodiments of the invention will now be described more fully with reference to the accompanying drawings, in which exemplary embodiments are shown. Exemplary embodiments of the invention may, however, be embodied in many different forms, and should not be construed as being limited to the embodiments set forth herein. Rather, these embodiments are provided so that this disclosure will be thorough and complete, and will fully convey the concept of embodiments of the invention to those of ordinary skill in the art. In the drawings, the thicknesses of layers and regions are exaggerated for clarity. Like reference numerals in the drawings denote like elements, and thus their description will be omitted.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper", and the like may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only, and is not intended to be limiting of exemplary embodiments. As used herein, the singular forms "a," "an" and "the" are intended to include the plural forms as well unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the invention are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances are to be expected. Thus, exemplary embodiments of the invention should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device, and are not intended to limit the scope of example embodiments.

Unless otherwise defined, all terms (including technical and scientific terms) used herein have the same meaning as commonly understood by one of ordinary skill in the art to which exemplary embodiments of the invention belong. It will be further understood that terms, such as those defined in commonly-used dictionaries, should be interpreted as having a meaning that is consistent with their meaning in the context of the relevant art, and will not be interpreted in an idealized or overly formal sense unless expressly so defined herein.

For the sake of simplicity, the description that follows will refer to an example of the present embodiment in which a mask is a deposition mask for a deposition apparatus used, for example, for fabricating a flat panel display (FPD), but exemplary embodiments of the invention may not be limited thereto. For example, a method of manufacturing a mask described herein can be applied to manufacture a variety of masks, such as a deposition mask for fabricating a semiconductor device or a photo mask to be used for a photolithography process.

In some embodiments, the deposition mask may be used for depositing layers serving, for example, as electrodes (i.e., anode and cathode) and organic emission layer of an organic electro luminescence (EL) display device. In other embodiments, the deposition mask may be used for forming patterns on a semiconductor wafer using a thermal or e-beam deposition method.

The photo mask may be used for transferring pattern images provided therein onto a photoresist layer provided on a substrate using a photolithography process. In some embodiments, the pattern images of the photo mask may correspond to elements constituting a thin film transistor or a pixel electrode of a liquid crystal display device. In other embodiments, the pattern images of the photo mask may correspond to at least one of elements constituting a semiconductor device.

FIG. 1A is a sectional view of a deposition apparatus used for fabricating a flat panel display.

Figure 1B:
FIG. 1B is a conceptual view of a photomask used for a photolithography process.

Referring to FIG. 1A, a deposition apparatus 10 may include a chamber 100, a deposition source 200, a mask assembly 300, and a fastening member 400. FIG. 1B shows a conceptual view of a photomask 300' used for a photolithography process.

Referring to FIG. 1, a deposition apparatus 10 may include a chamber 100, a deposition source 200, a mask assembly 300, and a fastening member 400.

The chamber 100 may be configured to provide a space for a deposition process. In the latter regard, the deposition process may be performed to supply an organic material and deposit an organic emission layer on a substrate S. A vacuum pump (not shown) may be connected to the chamber 100 to reduce pressure of the chamber 100.

In some embodiments, the deposition source 200 may be provided at a lower portion of an inner space of the chamber 100 to supply the organic material to a deposition surface of the substrate S provided at an upper portion of the inner space of the chamber 100. The mask assembly 300 may include a mask frame 320 and a mask 340, and may be disposed at the upper portion of the inner space of the chamber 100 so as to face the deposition source 200. The substrate S may be disposed on the mask assembly 300. The substrate S may be disposed vertically spaced apart from the mask assembly 300 by a predetermined space. In addition, the substrate S may overlap with the whole open area of an opening 322 of the mask frame 320 in plan view. The organic material supplied from the deposition source 200 may be deposited on the deposition surface (i.e., a bottom surface) of the substrate S through the opening 322 of the mask frame 320 and a slit pattern (not shown) of the mask 340. As a result, an organic layer deposited on the substrate S may include organic patterns, the shapes of which may correspond to those of the slit patterns of the mask 340. The fastening member 400 may be disposed outside a supply path of the organic material from the deposition source 200 to the substrate S so as to support an edge portion of the mask assembly 300.

Figure 2:
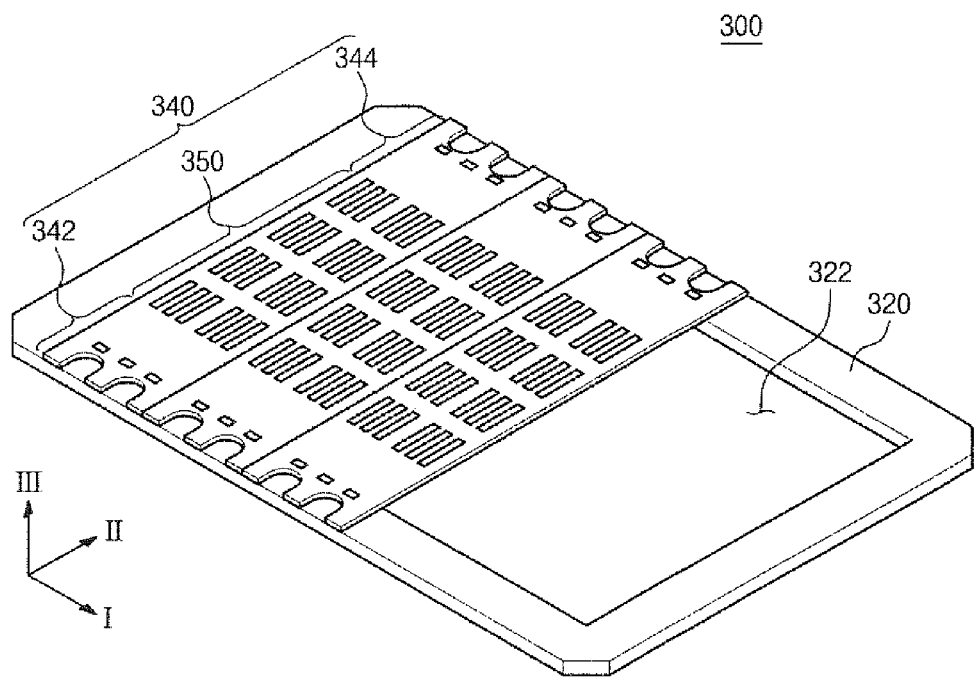
FIG. 2 is an enlarged perspective view illustrating a mask assembly of FIG. 1.

FIG. 2 is an enlarged perspective view illustrating a mask assembly of FIG. 1.

Referring to FIG. 2, the mask assembly 300 may include the mask frame 320 and a plurality of the masks 340.

The mask frame 320 may be shaped like a rectangular plate having the opening 322 provided therein. The masks 340 may be fastened on the mask frame 320 by means of a welding process. The mask frame 320 may be formed of a metallic material with high rigidity, i.e., exhibiting a low deformation property under an external force. The opening 322 may be formed so as to have a large enough open area to fully cover a target object (e.g., a display region of the substrate S in FIG. 1) of the deposition process and, for example, be shaped like a rectangle.

Hereinafter, for the sake of simplicity, first and second directions I and II will be used to denote directions parallel to long and short sides, respectively, of the mask frame 320, and a third direction III will be used to denote a direction normal to the mask frame 320, as shown in FIG. 2.

Each of the masks 340 may be shaped like a rectangular plate elongated along the second direction II. The masks 340 may be a fine metal mask formed of a metallic film. For example, the masks 340 may include a layer formed of stainless steel, invar, nickel, cobalt or any alloys thereof. In a longitudinal direction (i.e., the second direction II) of the mask 340, each of the masks 340 may have a pattern region 350 provided at a central region thereof, welding regions 342 and 344 being provided at both sides of the central region. The plurality of the masks 340 may be one-dimensionally arranged adjacent to each other along the first direction I on the mask frame 320. Each of the masks 340 may be disposed so as to cover the opening 322 of the mask frame 320. The welding regions 342 and 344 of the masks 340 may be welded to a long side of the maskframe 320.

Figure 3:
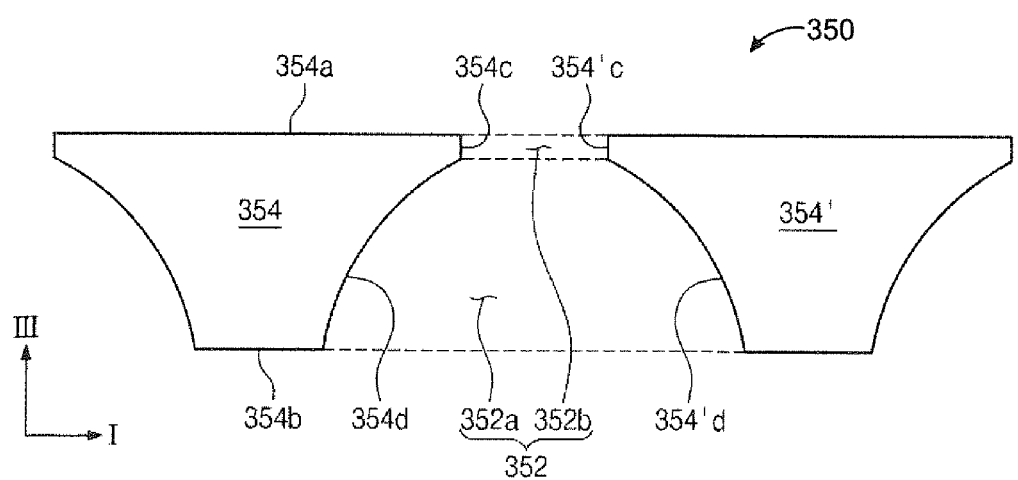
FIG. 3 is a sectional view enlarging a portion of a pattern region of FIG. 2.

FIG. 3 is a sectional view enlarging a portion of a pattern region of FIG. 2.

Referring to FIGS. 2 and 3, the pattern region 350 of each mask 340 may include a plurality of final ribs 354 and 354' defining a plurality of final slits 352. Each of the final slits 352 may have a section limited by two of the final ribs 354 and 354' disposed at left and right sides, respectively, thereof. In some embodiments, the final ribs 354 and 354' may have the same shape as each other.

The final rib 354 may have a top surface 354a wider than a bottom surface 354b thereof, and may have mirror symmetry with respect to a plane passing through its center point. For example, the final rib 354 may be shaped like a symmetrical trapezoid in a sectional view. The final rib 354 may include linear sidewalls 354c, each of which extends downward from an edge of the top surface 354a in a vertical direction, and curved sidewalls 354d, each of which extends from an edge of the corresponding one of the linear sidewalls 354c to an edge of the bottom surface 354b in an upward concave manner.

The final slits 352 may include inlets 352a which are limited by the curved sidewalls 354d and 354d' of the final ribs 354 and 354', respectively, and outlets 352b which are limited by the linear sidewalls 354c and 354'c of the final ribs 354 and 354', respectively. The organic material supplied from the deposition source 200 (in FIG. 1) may be deposited on the deposition surface of the substrate S (in FIG. 1) through the opening 322 of the mask frame 320 and through the inlets 352a and the outlets 352b of the final slits 352.

To realize a high resolution flat panel display, the mask 340 should be configured to have fine patterns. For example, the final ribs 354 and 354' should be formed to have a reduced pitch and/or a reduced size. However, the reduction in size of the final ribs 354 and 354' may lead to technical difficulties in a process of manufacturing the mask 340. For example, the linear sidewalls 354c and 354'c may be formed to have an unintended size or the linear sidewalls 354c and 354'c may disappear from the final ribs 354 and 354'. If the linear sidewalls 354c and 354'c are not formed to have a desired structure, the final ribs 354 and 354' may have a reduced rigidity, and may be deformed or distorted. This may result in a pattern failure of the mask 340.

The afore-described difficulties can be overcome by a method of manufacturing a mask according to exemplary embodiments of the invention. For example, the method may include forming the linear sidewalls 354c and 354'c of the final ribs 354 and 354', respectively, so as to have a desired dimension, shape and/or structure. Hereinafter, the methods of manufacturing a mask according to exemplary embodiments of the invention will be described in more detail with reference to the accompanying drawings.

Figure 4A:
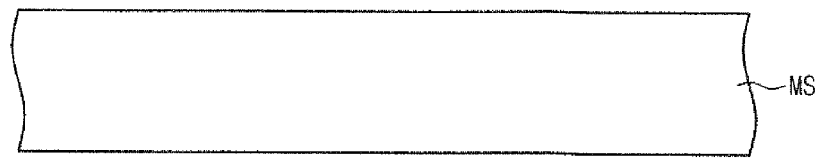
FIGS. 4A through 4H are sectional views illustrating a method of manufacturing a mask according to embodiments of the invention.
Figure 4B:
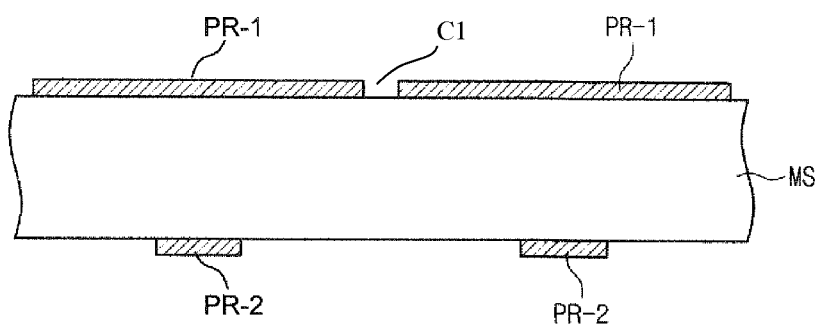
Figure 4C:
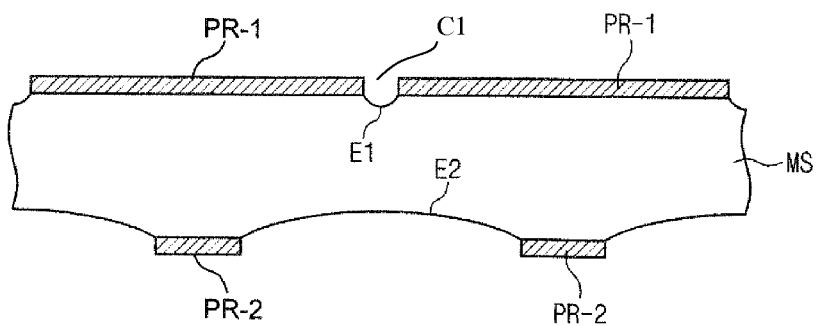
Figure 4D:
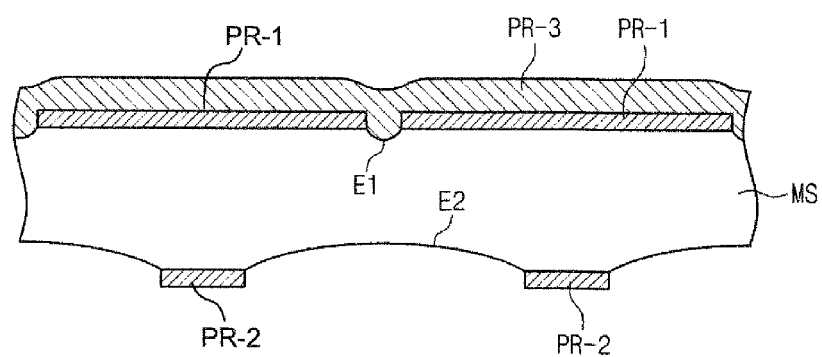
Figure 4E:
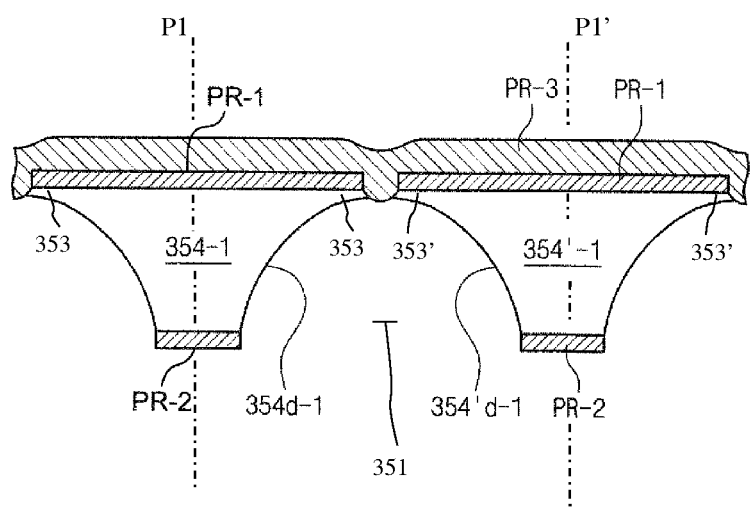
Figure 4F:
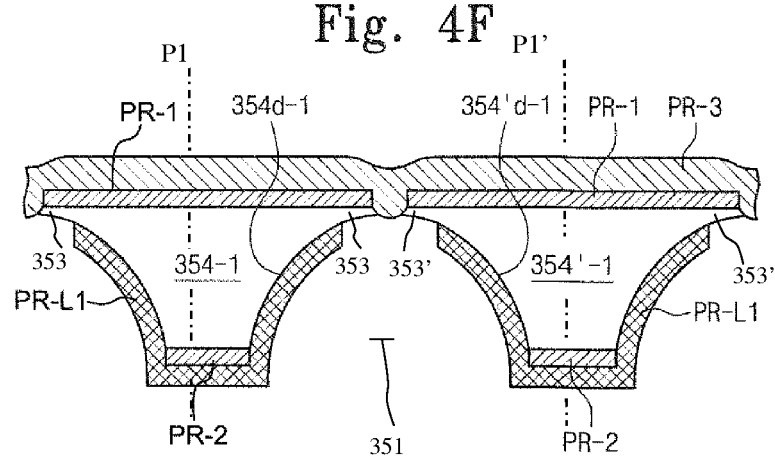
Figure 4G:
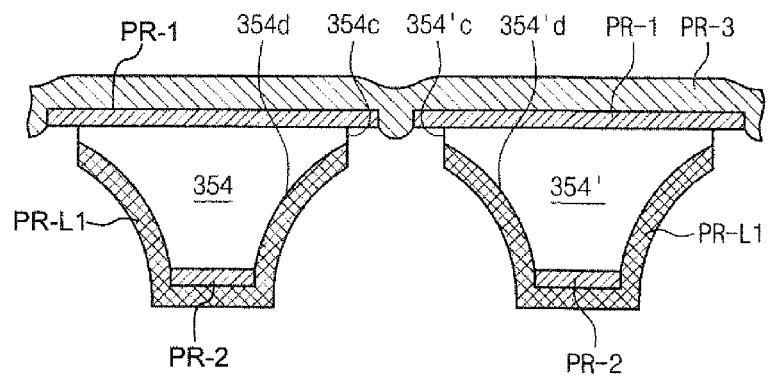
Figure 4H:
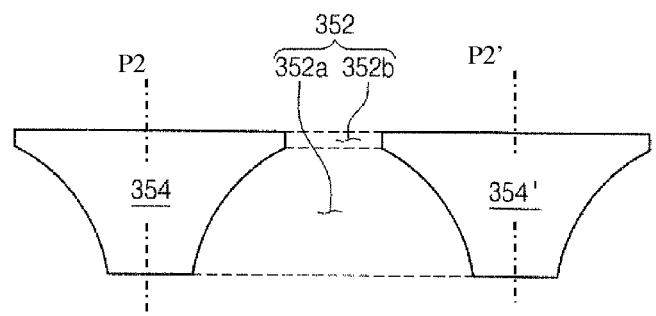
Figure 4I:
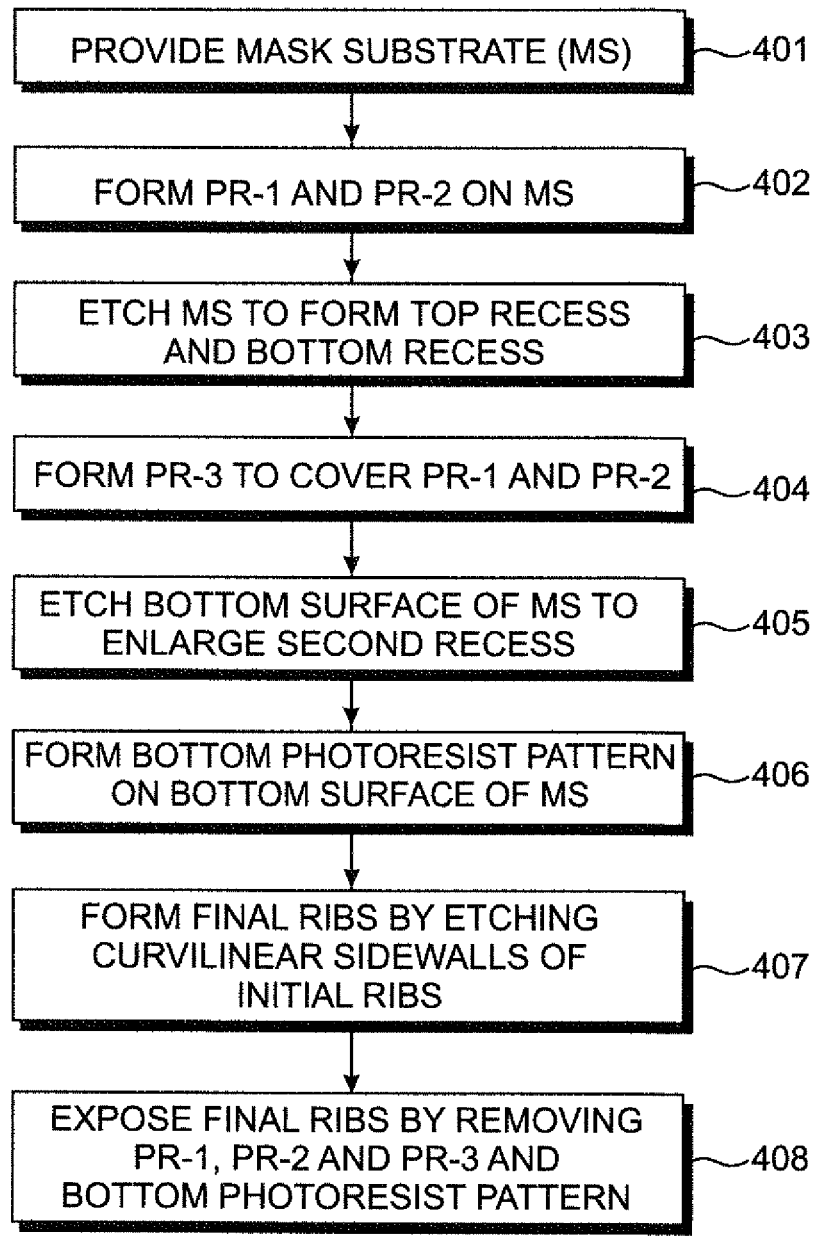
FIG. 4I is a flowchart illustrating the steps of the method of manufacturing the mask according to embodiments of the invention.

FIGS. 4A through 4H are sectional views illustrating a method of manufacturing a mask according to embodiments of the invention, and FIG. 4I is a flowchart illustrating the steps of the method of manufacturing the mask according to embodiments of the invention.

Referring to FIGS. 3 and 4A through 4I, a method of manufacturing a mask may include steps of forming initial ribs, as described with reference to FIGS. 4A through 4E, and steps of forming the final ribs 354 and 354', as described with reference to FIGS. 4F and 4G. The initial ribs may be formed so as to have top surfaces wider than those of the final ribs 354 and 354', and the formation of the final ribs 354 and 354' may include removing both end-portions 353 and 353' of the top surfaces of the initial ribs. In some embodiments, the formation of the initial ribs may include at least one photolithography process (as described with reference to FIGS. 4A through 4E), and the formation of the final ribs may include at least one photolithography process (as described with reference to FIGS. 4F and 4G).

Referring to FIG. 4A, a mask substrate MS may be provided to form the initial ribs and form the slit pattern (see FIG. 4I, block 401). The mask substrate MS may be a metallic plate formed of stainless steel, invar, nickel, cobalt or any alloys thereof.

Referring to FIG. 4B, a first photoresist pattern PR-1 may be formed on a top surface of the mask substrate MS (see FIG. 4I, block 402). The first photoresist pattern PR-1 has an opening C1 exposing a portion of the mask substrate MS. The first photoresist pattern PR-1 may be formed so as to have a width greater than that of a top surface of the final rib 354 or 354'. A space between the first photoresist pattern PR-1 may be less than a width of the outlet 352b of the final slits 352. A second photoresist pattern PR-2 may be formed on a bottom surface of the mask substrate MS (see FIG. 4I, block 402). The second photoresist pattern PR-2 may be formed so as to have a width corresponding to a width of a bottom surface of the final rib 354 or 354'. The second photoresist pattern PR-2 may be formed on the bottom surface of the mask substrate MS so as to face the first photoresist PR-1 provided on the top surface of the mask substrate MS, and so as to be aligned with an axis passing through a center point of the first photoresist PR-1.

Referring to FIG. 4C, the top surface of the mask substrate MS may be etched using the first photoresist pattern PR-1 as an etch mask to form a first recess E1 (see FIG. 4I, block 403). The first recess E1 may be formed so as to have a depth shallower than a vertical length of the linear sidewall 354c of the final rib 354 or 354'. The bottom surface of the mask substrate MS may be etched using the second photoresist pattern PR-2 as an etch mask so as to form a second recess E2 (see FIG. 4I, block 403). The second recess E2 may be formed so as to have a depth shallower than a vertical thickness of the curved sidewall 354d or 354'd of the final rib 354 or 354', respectively. The first and second recesses E1 and E2, respectively, may be formed using an isotropic etching process (e.g., a wet etching process).

Referring to FIG. 4D, a third photoresist pattern PR-3 may be formed on a top surface of the mask substrate MS so as to cover the first photoresist pattern PR-1 and the first recess E1 (see FIG. 4I, block 404).

Referring to FIG. 4E, the bottom surface of the mask substrate MS may be etched using the first, second and third photoresist patterns PR-1, PR-2 and PR-3, respectively, as etch masks so as to enlarge the second recess E2 (see FIG. 4I, block 405). The enlargement of the second recess E2 may be performed to expose a bottom surface of the first recess E1 and to form initial ribs 354-1 and 354'-1 limited by extended curvilinear sidewalls 354d-1 and 354'd-1, respectively. The initial ribs 354-1 and 354'-1 may have center planes P1 and P1', respectively. The extended curvilinear sidewalls 354d-1 and 354'd-1 may be formed so as to have a portion extended near the first recess E1, and thus, each of the extended curvilinear sidewalls 354d-1 and 354'd-1 may have a curvilinear length greater than that of the curved sidewall 354d or 354'd. The enlargement of the second recess E2 may be performed using an isotropic etching process (e.g., a wet etching process). Thus, initial slits 351 may be formed between the adjacent initial ribs 354-1 and 354'-1.

Hereinafter, steps of forming the final ribs 354 and 354' will be described with reference to FIGS. 4F through 4H.

Referring to FIG. 4F, a bottom photoresist pattern PR-L1 may be formed on the bottom surface of the mask substrate MS to cover the second photoresist pattern PR-2 disposed on the initial ribs 354-1 and 354'-1 (see FIG. 4I, block 406). In some embodiments, the bottom photoresist pattern PR-L1 may extend to partially cover the extended curvilinear sidewalls 354d-1 and 354'd-1. The bottom photoresist pattern PR-L1 may be formed to define positions and planar occupying areas of the final ribs 354 and 354'. For example, the bottom photoresist pattern PR-L1 may include portions having the same planar shape as the final ribs.

Referring to FIG. 4G, the extended curvilinear sidewalls 354d-1 and 354'd-1 of the initial ribs 354-1 and 354'-1, respectively, may be etched using the first, second and third photoresist patterns PR-1, PR-2 and PR-3, respectively, and the bottom photoresist pattern PR-L1 as etch masks to form final ribs 354 and 354' (see FIG. 4I, block 407). The final ribs 354 and 354' may be formed to have the linear sidewalls 354c and 354'c, respectively, and the curved sidewalls 354d and 354'd, respectively. In some embodiments, the etching of the extended curvilinear sidewalls 354d-1 and 354'd-1 may be performed using an isotropic etching process (e.g., a wet etching process) or an anisotropic etching process.

Referring to FIG. 4H, the first, second and third photoresist patterns PR-1, PR-2 and PR-3, respectively, and the bottom photoresist pattern PR-L1 may be removed to expose the final ribs 354 and 354' (see FIG. 4I, block 408). In some embodiments, the final ribs 354 and 354' may be formed to limit the final slits 352. The final ribs 354 and 354' may have center planes P2 and P2', respectively.

Figure 5A:
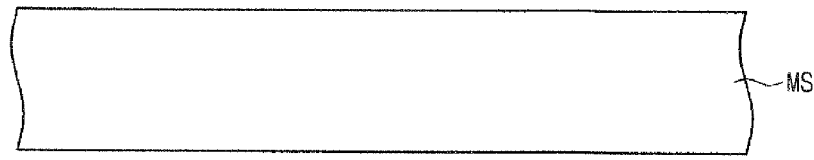
FIGS. 5A through 5I are sectional views illustrating a method of manufacturing a mask according to other embodiments of the invention.
Figure 5B:
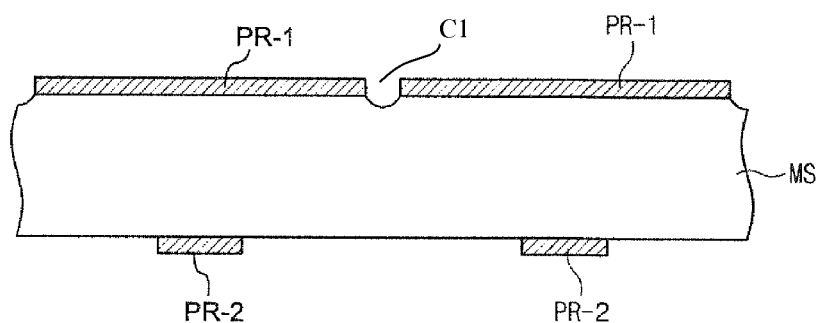
Figure 5C:
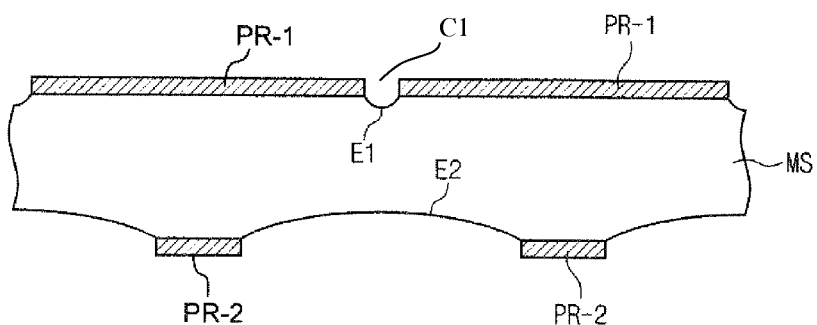
Figure 5D:
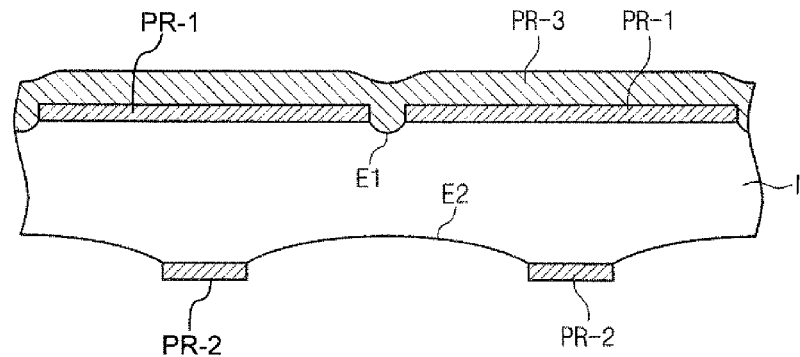
Figure 5E:
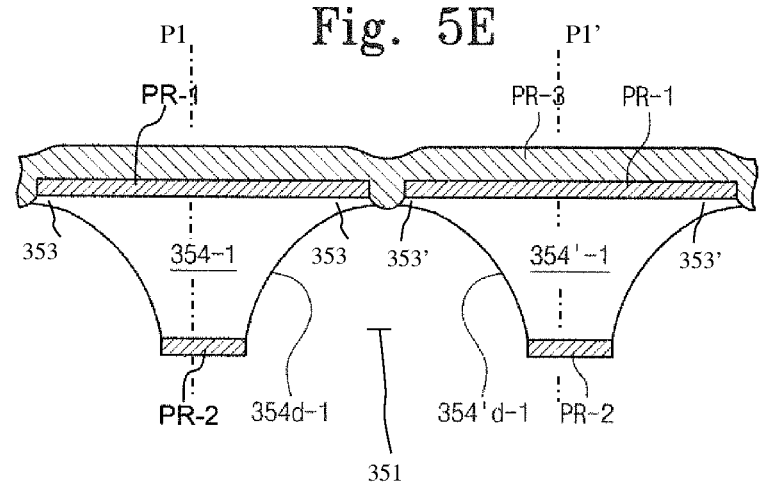
Figure 5F:
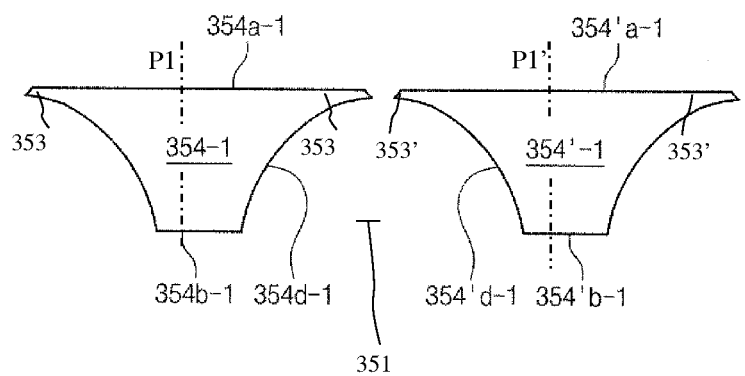
Figure 5G:
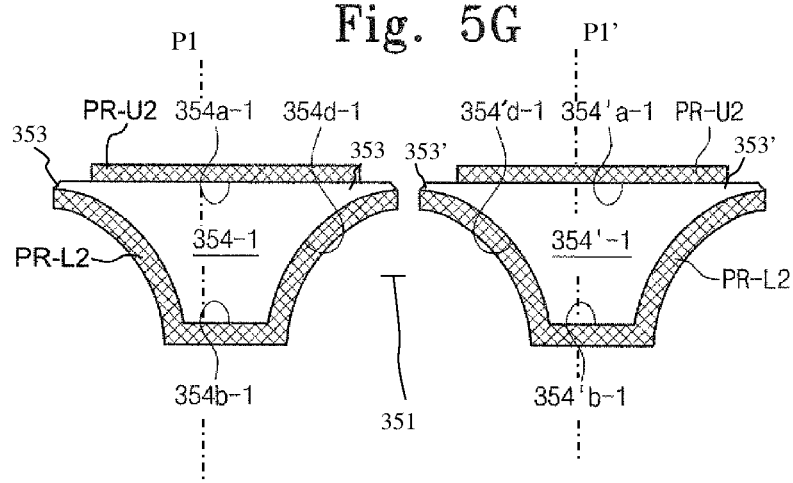
Figure 5H:
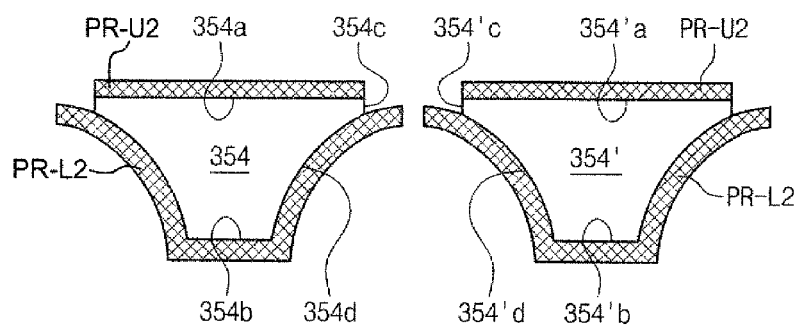
Figure 5I:
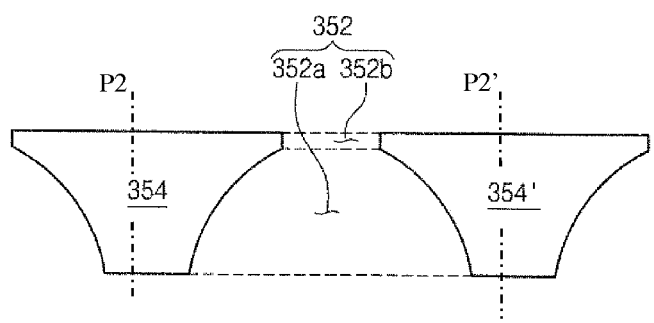
Figure 5J:
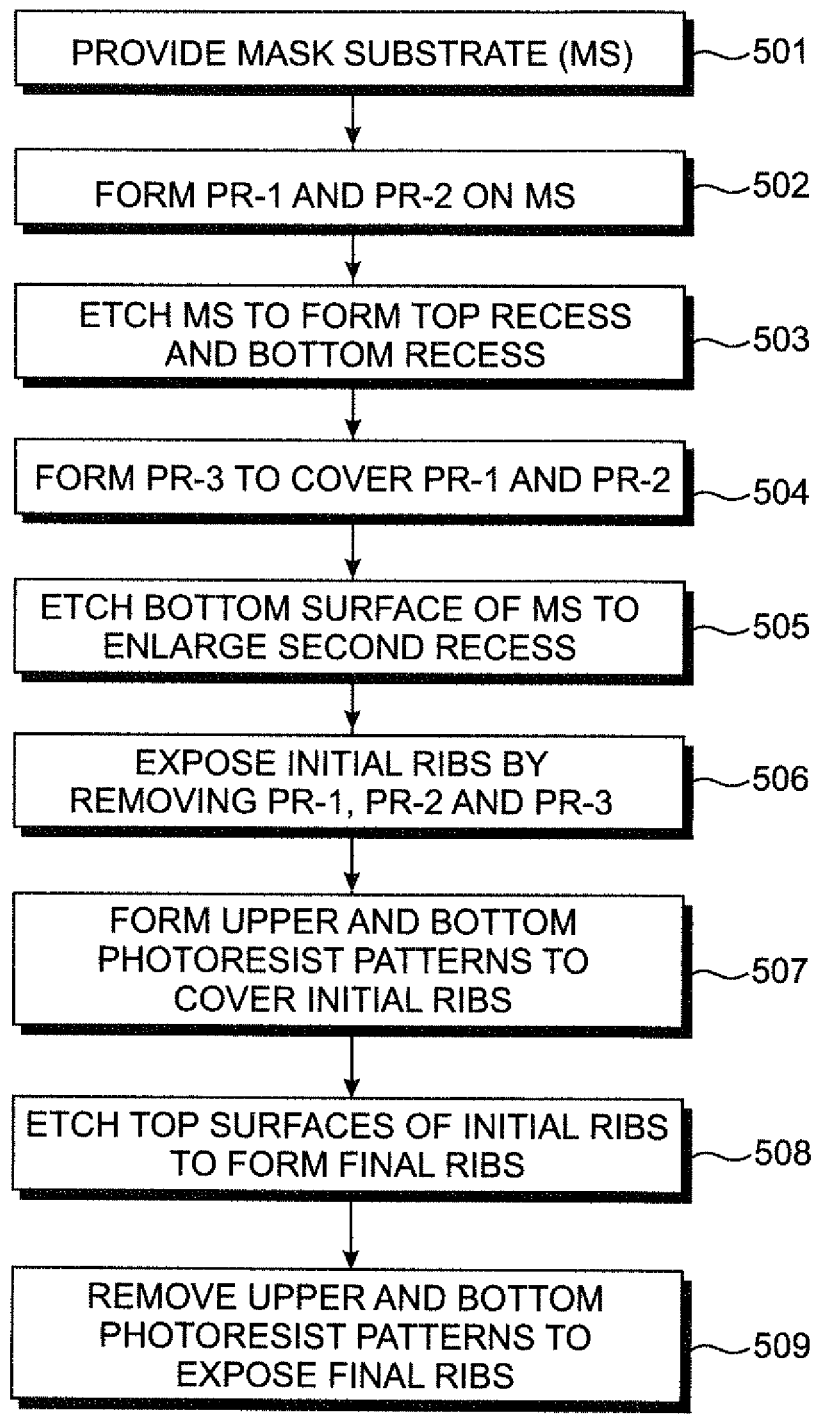
FIG. 5J is a flowchart illustrating the steps of the method of manufacturing the mask according to other embodiments of the invention.

FIGS. 5A through 5I are sectional views illustrating a method of manufacturing a mask according to other embodiments of the invention, and FIG. 5J is a flowchart illustrating the steps of the method of manufacturing the mask according to other embodiments of the invention.

Referring to FIGS. 3 and 5A through 5I, a method of manufacturing a mask may include steps of forming initial ribs depicted by FIGS. 5A through 5E (see FIG. 5J, blocks 501-505), and steps of forming the final ribs 354 and 354' depicted by FIGS. 5H and 5I. The initial ribs may be formed so as to have top surfaces wider than those of the final ribs 354 and 354', and the formation of the final ribs 354 and 354' may include removing both end-portions 353 and 353' of the top surfaces of the initial ribs. In some embodiments, the formation of the initial ribs may include at least one photolithography process (as depicted by FIGS. 5A through 5E) and the formation of the final ribs may include at least one photolithography process (as depicted by FIGS. 5F through 5I).

In some embodiments, the steps of forming the initial ribs shown in FIGS. 5A through 5E may be performed in substantially the same manner as described with reference to FIGS. 4A through 4E and, therefore, for the sake of brevity, these steps will not be described in much further detail. Hereinafter, steps of forming the final ribs 354 and 354' according to other exemplary embodiments of the invention will be described with reference to FIGS. 5F through 5I.

Referring to FIG. 5F, the first, second and third photoresist patterns PR-1, PR-2 and PR-3, respectively, may be removed to expose the initial ribs 354-1 and 354'-1 (see FIG. 5J, block 506).

Referring to FIG. 5G, the bottom photoresist pattern PR-L2 may be formed to wholly cover bottom surfaces 354b-1 and 354'b-1 and the extended curvilinear sidewalls 354d-1 and 354'd-1 of the initial ribs 354-1 and 354'-1 (see FIG. 5J, block 507). An upper photoresist pattern PR-U2 may be formed on top surfaces of the initial ribs 354-1 and 354'-1 (see FIG. 5J, block 507). The upper photoresist pattern PR-U2 may be formed to define positions and planar occupying areas of the final ribs 354 and 354'. For example, the upper photoresist pattern PR-U2 may include portions having the same planar shape as the final ribs 354 and 354'. The upper photoresist pattern PR-U2 may be formed on the initial ribs 354-1 and 354'-1 so as to face the bottom photoresist pattern PR-L2 and so as to be aligned with an axis passing through a center point of the bottom photoresist pattern PR-L2.

Referring to FIG. 5H, the top surfaces of the initial ribs 354-1 and 354'-1 may be etched using the upper and bottom photoresist patterns PR-U2 and PR-L2, respectively, as etch masks. As a result, portions of the initial ribs 354-1 and 354'-1 exposed by the upper photoresist pattern PR-U2 may be removed to form final ribs 354 and 354', respectively (see FIG. 5J, block 508). The final ribs 354 and 354' may be formed to have the linear sidewalls 354c and 354'c, respectively, and the curved sidewalls 354d and 354'd, respectively. In some embodiments, the partial removal of the initial ribs 354-1 and 354'-1 may be performed using an isotropic etching process (e.g., a wet etching process) or an anisotropic etching process.

Referring to FIG. 5I, the upper and bottom photoresist patterns PR-U2 and PR-L2, respectively, may be removed to expose the final ribs 354 and 354', respectively (see FIG. 5J, block 509). In some embodiments, the final ribs 354 and 354' may be formed to limit the final slits 352.

According to the previously described exemplary embodiments of the invention, the formation of the final ribs may include forming the initial ribs and removing edge portions of the initial ribs. Here, the initial ribs may be formed so as to have top widths greater than those of the final ribs, and a space between the initial ribs may be smaller than a width of a slit defined by the final ribs. As the result of the removal of the edge portions of the initial ribs, each of the final ribs may have a top width less than that of the initial rib.

According to the afore-described mask manufacturing method, the mask can be manufactured to include fine patterns capable of satisfying the technical requirements for dimension and shape thereof even in the case where the ribs should have small pitch and small dimension to meet the requirements for a mask pattern miniaturization. As a result, it is possible to prevent the fine patterns of the mask from being deformed.

According to the previously described exemplary embodiments of the invention, a mask with high-accuracy fine patterns can be provided. Furthermore, it is possible to prevent the fine patterns of the mask from being deformed. As a result, the mask can satisfy the technical requirements for a high-density semiconductor device or a high-resolution flat panel display. For example, the mask can be used to transfer or deposit high-resolution patterns provided thereon onto a target object.

While exemplary embodiments of the invention have been particularly shown and described, it will be understood by one of ordinary skill in the art that variations in form and detail may be made therein without departing from the spirit and scope of the attached claims.

What is claimed is:

1. A method of manufacturing a mask, comprising the steps of:
    patterning a mask substrate to form initial ribs and initial slits interposed between the initial ribs, a width of each initial slit being determined by a distance between upper edge portions of the immediately adjacent initial ribs which said each initial slit is interposed between; and
    respectively converting the initial ribs and the initial slits to final ribs and final slits by removing the upper edge portions of the initial ribs.

2. The method of claim 1, wherein each of the forming of the initial ribs and the initial slits and the converting of the initial ribs and the initial slits to the final ribs and the final slits comprises at least one photolithography process.

3. The method of claim 2, wherein the forming of the initial ribs and the initial slits comprises:
   forming a first pattern on a top surface of the mask substrate;
   forming a second pattern on a bottom surface of the mask substrate so as to face the first pattern;
   etching the top and bottom surfaces of the mask substrate by using the first and second patterns as etching masks to form first recesses in the top surface of the mask substrate and second recesses in the bottom surface of the mask substrate;
   forming a third pattern to cover the first pattern and the first recesses; and
   forming the initial ribs and the initial slits by etching the mask substrate with the first, second and third patterns as etching masks.

4. The method of claim 3, wherein a width of an opening of the first pattern, which exposes one of the initial slits, is less than a width of the final slit that is converted from said one of the initial slits.

5. The method of claim 3, wherein the converting of the initial ribs and the initial slits to the final ribs and the final slits comprises:
   forming a bottom pattern to cover the second pattern and portions of sidewalls of the initial ribs and to expose the upper edge portions of the initial ribs; and
   etching the upper edge portions of the initial ribs by using the first, second and third patterns and the bottom pattern as etching masks.

6. The method of claim 3, wherein the converting of the initial ribs and the initial slits to the final ribs and the final slits comprises:
   removing the first through third patterns;
   forming a bottom pattern to cover bottom surfaces and sidewalls of the initial ribs;
   forming an upper pattern to cover portions of top surfaces of the initial ribs and to expose the upper edge portions of the initial ribs; and
   etching the upper edge portions of the initial ribs by using the upper and bottom patterns as etching masks.

7. The method of claim 3, wherein the etching of the mask substrate by using the first, second and third patterns as etching masks is performed in an isotropic etching manner by using a wet etching process.

8. The method of claim 1, wherein the mask is one of a deposition mask used for a deposition process and a photo mask used for a photolithography process.

9. The method of claim 1, wherein each of the final ribs has a mirror-symmetric trapezoidal section having a top width which is greater than a bottom width thereof; and
   wherein each of the final ribs comprises a linear sidewall extending downward from an edge of a top surface of said each of final ribs along a vertical direction, and a curved sidewall extending from an edge of the linear sidewall to an edge of a bottom surface of said each of final ribs in a concave manner with respect to a center plane of said each of the final ribs.

10. A method of manufacturing a mask, comprising the steps of:
    forming an initial rib by using a first photolithography process, the initial rib including opposite upper edge portions with respect to a center plane of the initial rib, each of the opposite upper edge portions having a thickness decreasing in a direction away from the center plane of the initial rib; and
    removing the opposite upper edge portions of the initial rib by using a second photolithography process so as to form a final rib and a slit defined by the final rib, a top width of the final rib being less than a top width of the initial rib,
    the final rib comprising a linear sidewall extending downward from an edge of a top surface of the final rib along a vertical direction, and a curved sidewall extending from an edge of the linear sidewall to an edge of a bottom surface thereof in a concave manner with respect to a center plane of the final rib.

11. The method of claim 10, wherein the step of forming the initial rib comprises:
    forming a first pattern on a top surface of a mask substrate;
    forming a second pattern on a bottom surface of the mask substrate;
    etching the top surface of the mask substrate by using the first pattern as an etching mask to form a first recess having a depth smaller than a vertical length of the linear sidewall of the final rib, and etching the bottom surface of the mask substrate by using the second pattern as an etching mask to form a second recess having a depth smaller than a height of the curved sidewall of the final rib;
    forming a third pattern to cover the first pattern and the first recess; and
    etching the mask substrate by using the first, second and third patterns as etching masks to form an extended curvilinear sidewall of the initial rib, a curvilinear length of the extended curvilinear sidewall of the initial rib being greater than a curvilinear length of the curved sidewall of the final rib.

12. The method of claim 11, wherein the forming of the final rib comprises:
    forming a bottom pattern to cover the second pattern and portions of the extended curvilinear sidewall of the initial rib and to expose the opposite edge portions of the initial rib; and
    etching the opposite edge portions of the initial rib by using the bottom photoresist pattern as an etching mask to form the final rib having the linear sidewall and the curved sidewall.

13. The method of claim 11, wherein the forming of the final rib comprises:
    removing the first, second and third patterns;
    forming a bottom pattern to cover a bottom surface and the extended curvilinear sidewall of the initial rib;
    forming an upper pattern on a top surface of the initial rib and to expose the opposite edge portions of the initial rib; and
    etching the upper edge portions of the initial rib by using the upper and bottom patterns as etching masks to form the final rib having the linear sidewall and the curved sidewall.

14. The method of claim 13, wherein the mask is one of a deposition mask used for a deposition process of one of a flat panel display and a semiconductor device, and a photo mask used for a photolithography process of one of a flat panel display and a semiconductor device.

15. The method of claim 14, wherein the forming of the extended curvilinear sidewall of the initial rib is performed in an isotropic etching manner by using a wet etching process.

16. The method of claim 12, wherein the mask is one of a deposition mask used for a deposition process of one of a flat panel display and a semiconductor device, and a photo mask used for a photolithography process of one of a flat panel display and a semiconductor device.

17. The method of claim 16, wherein the forming of the extended curvilinear sidewall of the initial rib is performed in an isotropic etching manner by using a wet etching process.

* * * * *